United States Patent
Ohashi et al.

(10) Patent No.: US 10,176,974 B2
(45) Date of Patent: Jan. 8, 2019

(54) TUNGSTEN SPUTTERING TARGET AND METHOD FOR PRODUCING SAME

(71) Applicant: JX Nippon Mining & Metals Corporation, Tokyo (JP)

(72) Inventors: Kazumasa Ohashi, Ibaraki (JP); Kunihiro Oda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/515,194

(22) PCT Filed: Sep. 28, 2015

(86) PCT No.: PCT/JP2015/077265
§ 371 (c)(1),
(2) Date: Mar. 29, 2017

(87) PCT Pub. No.: WO2016/052380
PCT Pub. Date: Apr. 7, 2016

(65) Prior Publication Data
US 2017/0211176 A1    Jul. 27, 2017

(30) Foreign Application Priority Data
Sep. 30, 2014   (JP) ................................. 2014-201841

(51) Int. Cl.
| | |
|---|---|
| *H01J 37/34* | (2006.01) |
| *C23C 14/14* | (2006.01) |
| *C23C 14/34* | (2006.01) |
| *C22C 45/10* | (2006.01) |
| *C22C 27/04* | (2006.01) |
| *B22F 1/00* | (2006.01) |
| *B22F 3/10* | (2006.01) |
| *B22F 7/00* | (2006.01) |
| *H01L 21/285* | (2006.01) |

(52) U.S. Cl.
CPC ........ *H01J 37/3429* (2013.01); *B22F 1/0014* (2013.01); *B22F 3/10* (2013.01); *B22F 7/008* (2013.01); *C22C 27/04* (2013.01); *C22C 45/10* (2013.01); *C23C 14/14* (2013.01); *C23C 14/3414* (2013.01); *B22F 2301/20* (2013.01); *B22F 2301/255* (2013.01); *B22F 2304/10* (2013.01); *B22F 2998/10* (2013.01); *H01L 21/285* (2013.01)

(58) Field of Classification Search
CPC ..... C22C 27/04; C22C 45/10; C23C 14/3414; C23C 14/14; H01J 37/3426; H01J 37/3429; B22F 1/0014; B22F 3/10; B22F 7/008
See application file for complete search history.

(56) References Cited

U.S. PATENT DOCUMENTS

| | | | | |
|---|---|---|---|---|
| 3,045,331 | A * | 7/1962 | Ang .................... | H01H 1/025 420/495 |
| 6,582,535 | B1 | 6/2003 | Suzuki et al. | |
| 6,660,136 | B2 * | 12/2003 | Li ........................ | C23C 14/165 204/192.13 |
| 6,759,143 | B2 | 7/2004 | Oda et al. | |
| 7,956,464 | B2 | 6/2011 | Kim et al. | |
| 8,038,857 | B2 | 10/2011 | Inoue et al. | |
| 8,197,894 | B2 * | 6/2012 | Miller .................. | B22F 1/0014 427/192 |
| 8,764,877 | B2 | 7/2014 | Sato et al. | |
| 9,051,645 | B2 | 6/2015 | Senda et al. | |
| 9,812,301 | B2 | 11/2017 | Ohashi et al. | |
| 2006/0157451 | A1 | 7/2006 | Uenishi et al. | |
| 2011/0094879 | A1 | 4/2011 | Suzuki et al. | |
| 2014/0360871 | A1 | 12/2014 | Sato et al. | |
| 2015/0023837 | A1 | 1/2015 | Ohashi et al. | |
| 2015/0303040 | A1 | 10/2015 | Kaminaga et al. | |
| 2015/0357170 | A1 | 12/2015 | Ohashi et al. | |
| 2016/0148790 | A1 | 5/2016 | Suzuki et al. | |

FOREIGN PATENT DOCUMENTS

| | | |
|---|---|---|
| JP | S38-22608 B1 | 10/1963 |
| JP | S62-058524 A | 3/1987 |
| WO | 2014148588 A1 | 9/2014 |

* cited by examiner

*Primary Examiner* — Michael A Band
(74) *Attorney, Agent, or Firm* — Howson & Howson LLP

(57) ABSTRACT

A sputtering target containing 0.01 to 0.5 wt % of Ag, and remainder being W and unavoidable impurities. The object of the present invention is to provide a sputtering target capable of forming a film having a relatively low specific resistance by sputtering, wherein the obtained film is endowed with good uniformity, and in particular the sputtering target has superior characteristics upon forming thin films for semiconductor devices, as well as to provide a method for producing the foregoing sputtering target.

4 Claims, No Drawings

TUNGSTEN SPUTTERING TARGET AND METHOD FOR PRODUCING SAME

BACKGROUND

The present invention relates to a tungsten sputtering target and its production method, and in particular relates to a sputtering target capable of forming thin films for semiconductor devices having low resistance and which are stable, as well as to the production method thereof.

Semiconductor devices are being demanded of further miniaturization and higher integration each year, and improvements in production processes and research for new materials are being actively conducted. For instance, as gate electrodes, polycrystalline silicon and metal silicide are generally used, but research of using a gate electrode made completely from metal (metal electrode) is being conducted for attaining even lower resistance. Consequently, by combining this kind of gate electrode and high dielectric constant gate insulation film, faster speed and lower power consumption are enabled.

With certain semiconductor devices, W (tungsten) is being used as the foregoing metal electrode. A tungsten film (gate electrode) is normally formed by sputtering a tungsten target. Patent Document 1 discloses a W target containing 0.01 to 1 wt % of Ni for forming a part of the gate pattern; that is, for forming tungsten silicide. Furthermore, Patent Document 2 discloses a W target containing 10 to 30 at % of Ni for use in forming a barrier film.

Nevertheless, the thin films formed from the foregoing targets encountered a problem in that the specific resistance could not be sufficiently lowered. In particular, when using a gate electrode, if the specific resistance can be sufficiently lowered, the film thickness of the gate electrode can be thinned by that much. However, with a conventional W target containing Ni or the like, the foregoing benefits could not be enjoyed. Furthermore, conventionally, no particular attention was given to the evenness (uniformity) of the specific resistance.

PRIOR ART DOCUMENTS

Patent Documents

Patent Document 1: Japanese Patent Application Publication No. 2010-261103
Patent Document 2: International Publication No. WO 2010/119785

SUMMARY

An object of the present invention is to provide a sputtering target capable of forming a film having a low specific resistance by sputtering, wherein the sputtering target is effective for forming thin films (particularly gate electrodes) for semiconductor devices endowed with uniformity, and comprises superior characteristics upon forming thin films (gate electrodes), as well as to provide a method for producing the foregoing sputtering target.

As a result of intense study to resolve the foregoing problems, the present inventors discovered that it is possible to prevent Ag from dissolving in W (tungsten) and lower the specific resistance of the film by adding trace amounts of Ag to W (tungsten) and additionally devising the production method, as well as improve the uniformity of the specific resistance by suppressing the compositional variation of Ag. Based on these findings, the present inventors provide the following invention:

1) A sputtering target containing 0.01 to 0.5 wt % of Ag, and remainder being W and unavoidable impurities.
2) The sputtering target according to 1) above, wherein the sputtering target has a structure configured from a W matrix phase and Ag grains, and Ag is not dissolved in the W matrix phase.
3) The sputtering target according to 1) or 2) above, wherein an average grain size of the Ag grains is 0.1 to 10.0 μm.
4) The sputtering target according to any one of 1) to 3) above, wherein a compositional variation in the target is less than 10%.
5) The sputtering target according to any one of 1) to 4) above, wherein the sputtering target has a purity of 99.999% or higher.
6) A method of producing a sputtering target, wherein a W powder having an average grain size of 0.1 to 10.0 μm and a Ag powder having an average grain size of 0.1 to 10.0 μm are mixed to achieve a mix ratio of 0.01 to 0.5 wt % of Ag, and remainder being W and unavoidable impurities, and the mixed powder is sintered at a pressure of 15 to 30 MPa and a temperature of 1600 to 2000° C.

The present invention yields a superior effect of being able to produce a sputtering target suitable for forming thin films (particularly gate electrodes) for semiconductor devices since the sputtering target is able to form films having a low specific resistance and good uniformity.

DETAILED DESCRIPTION

The sputtering target of the present invention is characterized in containing 0.01 to 0.5 wt % of Ag, and remainder being W and unavoidable impurities. When the content of Ag is less than 0.01 wt %, it is not possible to sufficiently lower the specific resistance of the film. Meanwhile, when the content of Ag exceeds 0.5 wt %, Ag itself becomes an impurity in the formed thin film, and it is not possible to obtain the intended device characteristics, and is thus undesirable. Accordingly, the Ag content is set to be within the range of 0.01 to 0.5 wt %.

Furthermore, the structure of the sputtering target of the present invention is characterized in a structure configured from a W matrix phase and Ag grains, and Ag is not dissolved in the W matrix phase. This is because, if Ag is completely dissolved in the W matrix phase, the W crystal lattice will be subject to strain and the conduction electrons will scatter, and, because their movement will be obstructed, the electrical resistance will increase. In the present invention, a scanning electron microscope (magnification: 2000×) was used to observe 9 in-plane locations of the sputtering target (1 center point, 4 equal points of ½ R [radius], and 4 equal points of R [outer periphery]), and it was determined that Ag had not completely dissolved if Ag grains having a grain size of 0.1 μm or more were confirmed in a visual field of 1 mm².

Furthermore, while W itself crystallizes during sintering and Ag grains exist at the grain boundary of the W crystal grains, the average grain size of the Ag grains existing at the grain boundary is preferably 0.1 to 10.0 μm. When the average grain size is less than 0.1 μm, only the same effect as in cases where Ag is dissolved can be yielded. Meanwhile, when the average grain size exceeds 10.0 μm, nodules tend to become generated due to the difference in the sputter rate of Ag and W, which in turn causes the generation of particles, and is thus undesirable. Note that the average grain size can be calculated using the crystal grain size measurement method (cross-cut method).

With the sputtering target of the present invention, the compositional variation of Ag in the target is preferably less than 10%. As described later, the compositional variation of Ag in the target can be suppressed by adjusting the grain size of the raw material powder and adjusting the mixing conditions. This is because the uniformity of the specific resistance will considerably deteriorate when the compositional variation of Ag exceeds the foregoing numerical range.

The variation in the composition of Ag is calculated as follows; specifically, the Ag content is measured in the respective points (volume: 0.5 to 2 cm$^3$) with regard to a total of 17 points in a disk-shaped target including 1 center point, 8 equal points of ½ R (radius), and 8 equal points that are 1 cm inward from the outer periphery (outer periphery), and the following formula is used based on the obtained maximum value, minimum value, and average value of the Ag content.

Compositional variation of Ag (%)={(maximum value of Ag content)−(minimum value of Ag content)}/(average value of Ag content)×100

Preferably, the sputtering target of the present invention has a purity of 99.999% (5N) or higher. Note that the purity can be calculated from the impurity content measured using GDMS (Glow Discharge Mass Spectrometry), and the impurities do not include W and Ag as constituent elements, and gas components (O, C, N, H, S, and P). The thin films formed with the target of present invention are particularly used as the gate electrodes in semiconductor devices, but when numerous metal impurities such as alkali metals and transition metals are contained in the gate electrodes, these impurities degrade the device characteristics, and deteriorate the quality as a semiconductor device.

The sputtering target of the present invention can be prepared using the powder sintering method.

Foremost, a W powder having an average grain size of 0.1 to 10.0 μm and a Ag powder having an average grain size of 0.1 to 10 μm are prepared. These raw material powders preferably have a purity of 5N or higher. Subsequently, these powders are mixed to achieve a mix ratio where the Ag content is 0.01 to 0.5 wt %. Ag can be uniformly mixed by mixing the powders with a pot mill or via mechanical alloying.

Subsequently, the mixed powder is sintered by being hot pressed at a pressure of 10 to 50 MPa and a temperature of 1600 to 2000° C. to prepare a target material (sintered body). When the sintering temperature is too low, there is a problem in that the density of the sintered body will be insufficient. Meanwhile, when the sintering temperature is too high, there is a possibility that Ag will dissolve in W. Furthermore, the reason why the pressure is set to 15 to 30 MPa during sintering is because, when the pressure is low at less than 15 MPa, the density will not increase, and, when high pressure is applied in excess of 30 MPa, layered cracks are generated parallel to the pressed surface.

Furthermore, it is effective to perform cold isostatic press treatment (CIP treatment) or hot isostatic press treatment (HIP treatment) to additionally increase the target density. HIP treatment may be performed under the conditions of 1600 to 2000° C. and 100 to 200 MPa. It is thereby possible to obtain a sintered body having a density of 95% or higher. The thus obtained sintered body can be machined via cutting and polishing to prepare a target. Furthermore, when the target is to be used as a sputtering target, the target is bonded to a backing plate prior to use.

EXAMPLES

The Examples of the present invention are now explained. Note that these Examples are merely illustrative, and the present invention shall in no way be limited thereby. In other words, this invention also includes various modifications and other embodiments that are covered by the technical scope of the present invention.

Example 1

As the raw material powder, a W powder having a purity of 5 or higher and an average grain size of 2.0 μm, and a Ag powder having a purity of 5N or higher and an average grain size of 5.0 μm were used and blended at a predetermined ratio, and mixed in a pot mill. Subsequently, the mixed powder was filled in a carbon mold, and hot pressed at 15 MPa by being heated to 1800° C. in a vacuum atmosphere. Consequently obtained was a sintered body containing 0.05 wt % of Ag and the remainder being W and unavoidable impurities. Here, the sintered body density was 99.1%. Subsequently, the thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was less than 10%. Furthermore, as a result of observing this target with a scanning electron microscope, Ag grains were confirmed at the grain boundary of the W crystals.

Subsequently, this target was sputtered to form a Ag-containing tungsten thin film. Note that the sputtering conditions were as follows; specifically, power source: DC system, power: 15 kW, ultimate vacuum: 5×10$^{-8}$ Torr, atmosphere gas composition: Ar, sputter gas pressure: 5×10$^{-3}$ Torr, and sputter time: 15 seconds (the same sputtering conditions were adopted in the ensuing Examples and Comparative Examples). Using the obtained thin film, the sheet resistance of the film was measured with OmniMap manufactured by KLA-Tencor, and the film thickness was measured based on XRR (X-ray reflectivity measurement) to calculate the specific resistance (Ω·cm) of the film. Consequently, compared to cases where Ag is not contained (Comparative Example 1), the specific resistance decreased by 8%. Furthermore, as a result of measuring the evenness (uniformity) of the in-plane specific resistance, a favorable result of 5% or less was obtained. The foregoing results are shown in Table 1.

TABLE 1

| | Composition | Raw Material | Mixing Method | Sintering/ Melting | Ag concentration [wt %] | | | Variation [%] | SEM observation of sintered body | Specific resistance of film | Uniformity of Rs |
| | | | | | Ave. | Max. | Min. | | | | |
| --- | --- | --- | --- | --- | --- | --- | --- | --- | --- | --- | --- |
| Example 1 | 0.05 wt % Ag | W powder, Ag powder | Pot mill | Sintering | 0.05 | 0.05 | 0.05 | 0 | Ag grains were confirmed | 92% | 5% or less |
| Example 2 | 0.05 wt % Ag | W powder, Ag block | Mechanical alloying | Sintering | 0.05 | 0.05 | 0.05 | 0 | Ag grains were confirmed | 91% | 5% or less |

TABLE 1-continued

| | Composition | Raw Material | Mixing Method | Sintering/ Melting | Ag concentration [wt %] | | | | SEM observation of sintered body | Specific resistance of film | Uniformity of Rs |
| --- | --- | --- | --- | --- | --- | --- | --- | --- | --- | --- | --- |
| | | | | | Ave. | Max. | Min. | Variation [%] | | | |
| Example 3 | 0.5 wt % Ag | W powder, Ag powder | Pot mill | Sintering | 0.5 | 0.52 | 0.49 | 6 | Ag grains were confirmed | 82% | 5% or less |
| Example 4 | 0.5 wt % Ag | W powder, Ag block | Mechanical alloying | Sintering | 0.5 | 0.51 | 0.49 | 4 | Ag grains were confirmed | 81% | 5% or less |
| Comparative Example 1 | Pure W | W powder | — | Sintering | — | — | — | — | — | 100% | 5% or less |
| Comparative Example 2 | 0.05 wt % Ag | W powder, Ag powder | V mixer | Sintering | 0.05 | 0.06 | 0.04 | 40 | Ag grains were confirmed | 91% | 10% or more |
| Comparative Example 3 | 0.5 wt % Ag | W powder, Ag powder | V mixer | Sintering | 0.5 | 0.55 | 0.43 | 24 | Ag grains were confirmed | 83% | 10% or more |
| Comparative Example 4 | 0.05 wt % Ag | W block, Ag block | — | EB melting | 0.05 | 0.05 | 0.05 | 0 | Ag grains were not confirmed | 99% | 5% or less |

Example 2

As the raw material powder, a W powder having a purity of 5 or higher and an average grain size of 2.0 μm, and a Ag block having a purity of 5N or higher were used and blended at a predetermined ratio, and mixed via mechanical alloying. Subsequently, the mixed powder was filled in a carbon mold, and hot pressed at 30 MPa by being heated to 1600° C. in a vacuum atmosphere. Consequently obtained was a sintered body containing 0.05 wt % of Ag and the remainder being W and unavoidable impurities. Here, the sintered body density was 99.1%.

The thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was less than 10%. Furthermore, as a result of observing this target with a scanning electron microscope, Ag grains were confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), the specific resistance decreased by 9%. Furthermore, as a result of measuring the evenness (uniformity) of the in-plane specific resistance, a favorable result of 5% or less was obtained.

Example 3

As the raw material powder, a W powder having a purity of 5 or higher and an average grain size of 2.0 μm, and a Ag powder having a purity of 5N or higher and an average grain size of 10.0 μm were used and blended at a predetermined ratio, and mixed in a pot mill. Subsequently, the mixed powder was filled in a carbon mold, and hot pressed at 20 MPa by being heated to 1700° C. in a vacuum atmosphere. Consequently obtained was a sintered body containing 0.05 wt % of Ag and the remainder being W and unavoidable impurities. Here, the sintered body density was 99.2%.

The thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was less than 10%. Furthermore, as a result of observing this target with a scanning electron microscope, Ag grains were confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), the specific resistance decreased by 18%. Furthermore, as a result of measuring the evenness (uniformity) of the in-plane specific resistance, a favorable result of 5% or less was obtained.

Example 4

As the raw material powder, a W powder having a purity of 5 or higher and an average grain size of 2.0 μm, and a Ag block having a purity of 5N or higher were used and blended at a predetermined ratio, and mixed via mechanical alloying. Subsequently, the mixed powder was filled in a carbon mold, and hot pressed at 30 MPa by being heated to 1600° C. in a vacuum atmosphere. Consequently obtained was a sintered body containing 0.5 wt % of Ag and the remainder being W and unavoidable impurities. Here, the sintered body density was 99.4%.

The thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was less than 10%. Furthermore, as a result of observing this target with a scanning electron microscope, Ag grains were confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), the specific resistance decreased by 19%. Furthermore, as a result of measuring the evenness (uniformity) of the in-plane specific resistance, a favorable result of 5% or less was obtained.

Comparative Example 1

As the raw material powder, a W powder having a purity of 5 or higher and an average grain size of 2.0 μm was used and filled in a carbon mold, and hot pressed at 25 MPa by being heated to 1800° C. in a vacuum atmosphere. Consequently obtained was a sintered body containing W and unavoidable impurities. Here, the sintered body density was 99.2%. The thus obtained sintered body was machined via cutting and polishing to prepare a disk-shaped sputtering target having a diameter of 440 mm and a thickness of 3 mm. Subsequently, this target was sputtered to form a tungsten thin film. Using the obtained thin film, the specific resistance (Ω·cm) of the film was measured in the same manner as Example 1. With the specific resistance of Comparative Example 1 as the reference, the Comparative Examples were compared with the Examples.

Comparative Example 2

As the raw material powder, a W powder having a purity of 5 or higher and an average grain size of 2.0 μm, and a Ag powder having a purity of 5N or higher and an average grain size of 2.0 μm were used and blended at a predetermined ratio, and mixed with a V-shaped mixer. Subsequently, the mixed powder was filled in a carbon mold, and hot pressed at 30 MPa by being heated to 1700° C. in a vacuum atmosphere. Consequently obtained was a sintered body containing 0.05 wt % of Ag and the remainder being W and unavoidable impurities. Here, the sintered body density was 99.2%.

The thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was 40%. Furthermore, as a result of observing this target with a scanning electron microscope, Ag grains were confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), while the specific resistance decreased by 9%, as a result of measuring the evenness (uniformity) of the in-plane specific resistance, the result was 10% or more.

Comparative Example 3

As the raw material powder, a W powder having a purity of 5 or higher and an average grain size of 2.0 μm, and a Ag powder having a purity of 5N or higher and an average grain size of 5.0 μm were used and blended at a predetermined ratio, and mixed with a V-shaped mixer. Subsequently, the mixed powder was filled in a carbon mold, and hot pressed at 20 MPa by being heated to 1600° C. in a vacuum atmosphere. Consequently obtained was a sintered body containing 0.5 wt % of Ag and the remainder being W and unavoidable impurities. Here, the sintered body density was 99.6%.

The thus obtained sintered body was machined via cutting and polishing to prepare a disk-shaped sputtering target having a diameter of 440 mm and a thickness of 3 mm, and the compositional variation of Ag in this target was examined. Consequently, the compositional variation of Ag was 24%. Furthermore, as a result of observing this target with a scanning electron microscope, Ag grains were confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), while the specific resistance decreased by 17%, as a result of measuring the evenness (uniformity) of the in-plane specific resistance, the result was 10% or more.

Comparative Example 4

As the raw material powder, a W block having a purity of 5 or higher and a Ag block having a purity of 5N or higher were used and placed in a furnace at a predetermined ratio, and subject to EB melting. Consequently obtained was an ingot containing 0.05 wt % of Ag and the remainder being W and unavoidable impurities. The thus obtained ingot was machined via cutting and polishing to prepare a disk-shaped sputtering target having a diameter of 440 mm and a thickness of 3 mm. Furthermore, as a result of observing this target with a scanning electron microscope, Ag grains were not confirmed at the grain boundary of the W crystals. Subsequently, this target was sputtered to form a Ag-containing tungsten thin film. Using the obtained thin film, the specific resistance (Ω·cm) of the film was measured in the same manner as Example 1. Consequently, compared to cases where Ag is not contained (Comparative Example 1), no decrease in the specific resistance could be observed.

The sputtering target of the present invention and the production method thereof are effective for forming thin films (particularly gate electrodes) for semiconductor devices since the sputtering target yields superior effects of being able to form films having a low specific resistance and favorable uniformity of the specific resistance.

The invention claimed is:

1. A sputtering target consisting of Ag in an amount of 0.01 to 0.5 wt %, W, and unavoidable impurities, and having a compositional variation of Ag in the sputtering target of less than 10% and a sintered structure configured from a W matrix phase and Ag grains, wherein the Ag grains are located at grain boundaries of the W matrix phase, and wherein an average grain size of the Ag grains existing at grain boundaries is 0.1 to 10 μm.

2. The sputtering target according to claim 1, wherein the sputtering target has a purity of 99.999% or higher.

3. A method of producing a sputtering target, wherein a W powder having an average grain size of 0.1 to 10 μm and a Ag powder having an average grain size of 0.1 to 10 μm are mixed to achieve a mix ratio of 0.01 to 0.5 wt % of Ag, and remainder being W and unavoidable impurities, and the mixed powder is sintered at a pressure of 15 to 30 MPa and a temperature of 1600 to 2000° C. to produce a sputtering target consisting of Ag in an amount of 0.01 to 0.5 wt %, W, and unavoidable impurities, and having a compositional variation of Ag in the target of less than 10% and a sintered structure configured from a W matrix phase and Ag grains, wherein the Ag grains are located at grain boundaries of the W matrix phase, and wherein an average grain size of the Ag grains existing at grain boundaries is 0.1 to 10 μm.

4. A sputtering target consisting of W and 0.01 to 0.5 wt % of Ag, a compositional variation of the Ag in the sputtering target being less than 10%, and a sintered structure of the sputtering target being configured from W crystal grains and Ag grains-such that the Ag grains exist at grain boundaries of the W crystal grains and are not dissolved in the W crystal grains, and wherein an average grain size of the Ag grains existing at grain boundaries is 0.1 to 10 μm.

* * * * *